United States Patent [19]

Nishizawa et al.

[11] 3,947,548

[45] Mar. 30, 1976

[54] PROCESS OF GROWING SINGLE CRYSTALS OF GALLIUM PHOSPHIDE

[75] Inventors: Jun-Ichi Nishizawa; Ken Suto; Yasuo Okuno, all of Sendai, Japan

[73] Assignee: Semiconductor Research Foundation, Japan

[22] Filed: Aug. 28, 1973

[21] Appl. No.: 392,190

Related U.S. Application Data

[63] Continuation-in-part of Ser. No. 182,769, Sept. 22, 1971, abandoned.

[30] Foreign Application Priority Data

Oct. 1, 1970 Japan................................ 45-86521

[52] U.S. Cl................. 423/299; 423/305; 156/616; 156/620

[51] Int. Cl.²......................................... C01B 25/00

[58] Field of Search....... 423/299; 23/305; 156/616, 156/617, 619, 620, 621, 622, 624

[56] References Cited
UNITED STATES PATENTS

| | | | |
|---|---|---|---|
| 3,206,406 | 9/1965 | Barkemeyer et al................ | 423/299 |
| 3,278,342 | 10/1966 | John et al............................ | 423/299 |
| 3,565,702 | 2/1971 | Nelson................................. | 423/299 |
| 3,615,203 | 10/1971 | Kaneko et al....................... | 423/299 |

*Primary Examiner*—Oscar R. Vertiz
*Assistant Examiner*—Gregory A. Heller
*Attorney, Agent, or Firm*—Robert E. Burns; Emmanuel J. Lobato; Bruce L. Adams

[57] ABSTRACT

A single crystal of gallium phosphide including 0.5 atomic ratio or less of indium is grown from a melt consisting of indium, gallium and phosphorous with an atomic ratio of gallium to phosphorous equal to at least 2.0.

3 Claims, 4 Drawing Figures

PROCESS OF GROWING SINGLE CRYSTALS OF GALLIUM PHOSPHIDE

CROSS REFERENCE TO RELATED APPLICATION

This application is a continuation-in-part of U.S. application Ser. No. 182,769 made Sept. 22, 1971 and now abandoned.

BACKGROUND OF THE INVENTION

This invention relates to a process of producing single crystals of gallium phosphide from the melt containing indium as a solvent.

Upon growing single crystals of gallium phosphide (GaP) from the liquid phase, there has been generally prepared a melt including gallium(Ga), as the so-called solvent and having an amount of gallium phosphide melted thereinto to its saturated solubility at that temperature from which the growth is initiated. Then, the melt including a seed crystal is slowly cooled from a temperature of 1,000°C or more to room temperature to epitaxially grow a single crystal of gallium phosphide on the seed crystal. Alternatively, the melt without a seed crystal may be slowly cooled to freely grow a dendritic crystal or crystals in the solvent. In either case, the practically usable temperature of the gallium melt is within a range of from 900°C to 1,100°C within which the gallium phosphide has a solubility of from 1 to 6% to the solvent, gallium. Thus, in order to grow a predetermined amount of a single crystal of gallium phosphide it is required to use the element gallium in a very large amount as compared with the required amount of the single crystal. About 5 to 50 grams of the element gallium is normally required for performing one epitaxial growth operation.

If the solvent can be formed of the element indium which is more inexpensive than the gallium, then single crystals of gallium phosphide can be formed with a decreased cost. The use of indium as a solvent for the growth of single crystals of gallium phosphide is described in U.S. Pat. No. 3,278,342 issued on Oct. 11, 1966 to H.F. John et al. The cited patent teaches the solvent, indium having melted thereinto from 5 to 15 molar percent of gallium phosphide. However, as will readily be understood, the melting of gallium phosphide into the element indium leads to the growth of mixed crystals expressed by $In_xGa_{1-x}P$ where $x$ varies between 0 and 1 but not of single crystals of gallium phosphide. The mixed crystal expressed by $In_xGa_{1-x}P$ is composed of InP crystals and GaP crystals in a molar ratio of $x/(1-x)$. On the other hand, lattice constants of the InP and GaP crystals are of 5.8687 and 5.4505A respectively so that a difference therebetween is great. Thus, such a mixed crystal is normally bad in crystallographic properties. Particularly, the crystallographic properties are much deteriorated for the $x$ ranging from 0.2 to 0.8. Also the two are different in the forbidden band from each other and therefore they can not be equally utilized. For example, it has been experimentally found that with from 5 to 10 molar percent of gallium phosphide melted into the solvent, indium, the resulting mixed crystal has a value of the $x$ approximately equal to 0.2 and becomes normally unhomogeneous in the composition within a single crystal. This has resulted in the deterioration of the crystallographic properties while differentiating the wavelengths of light emitted therefrom from those exhibited by the gallium phosphide crystal. Thus it is difficult to use mixed crystals $In_xGa_{1-x}P$ as a material of semiconductor light-emitting diodes, assuming that it is equivalent to the single crystal of gallium phosphide.

Accordingly it is an object of the present invention to provide an improved process of producing single crystals of gallium phosphide from a melt at a low cost by minimizing an amount of a raw material not contributing directly to the formation of the single crystals.

SUMMARY OF THE INVENTION

According to the principles of the present invention, there is provided a process of producing single crystals of gallium phosphide or epitaxially grown layers thereof from a melt containing indium as a solvent, which process comprises heating a mixture of indium, gallium and phosphorous to form a melt and thereafter slowly cooling the melt to room temperature at a cooling rate of from 100° to 0.5°C per hour, wherein the melt has an atomic ratio of the gallium to phosphorous is equal to at least 2.0 and preferably to at least 2.5 to produce the single crystals or expitaxially grown layer thereof including 0.5 atomic percent or less of indium.

BRIEF DESCRIPTION OF THE DRAWINGS

The present invention will become more apparent from the following detailed description taken in conjunction with the accompanying drawings in which.

DESCRIPTION OF THE PREFERRED EMBODIMENTS

The present invention is based upon the discovery that a melt including indium, gallium and phosphorous can yield single crystals of substantially gallium phosphide including 1 atomic percent or less of indium as long as an atomic proportion of gallium to phosphorous exceeds a certain limit in the melt. Although the resulting crystals may be considered to be the extremity of the mixed crystals $In_xGa_{1-x}P$ where $x$ has a value of 0.02 or less, the presence of such a very small amount of indium in the crystal prevents not only the forbidden band of the crystal from being differentiated from that of the single crystal of gallium phosphide but also permits the lattice constants to change only negligibly as compared with those of the single crystal. Thus the mixed crystals including 1 atomic percent or less of indium can be said to be equivalent in crystallographic properties to the single crystal of gallium phosphide While the residual indium may be considered to be an impurity, it is electrically inactive to the crystals because the indium belongs to the same group of the Periodic Table as the gallium.

In practicing the present invention, the element gallium and phosphorous can be added to indium as a solvent to form a melt. The phosphorous is preferably red phosphorous. Alternatively, gallium phosphide and the element gallium may be added to the indium. In any case it is to be noted that an atomic ratio of gallium to phosphorous be equal to or more than 2.5

Figure 1:
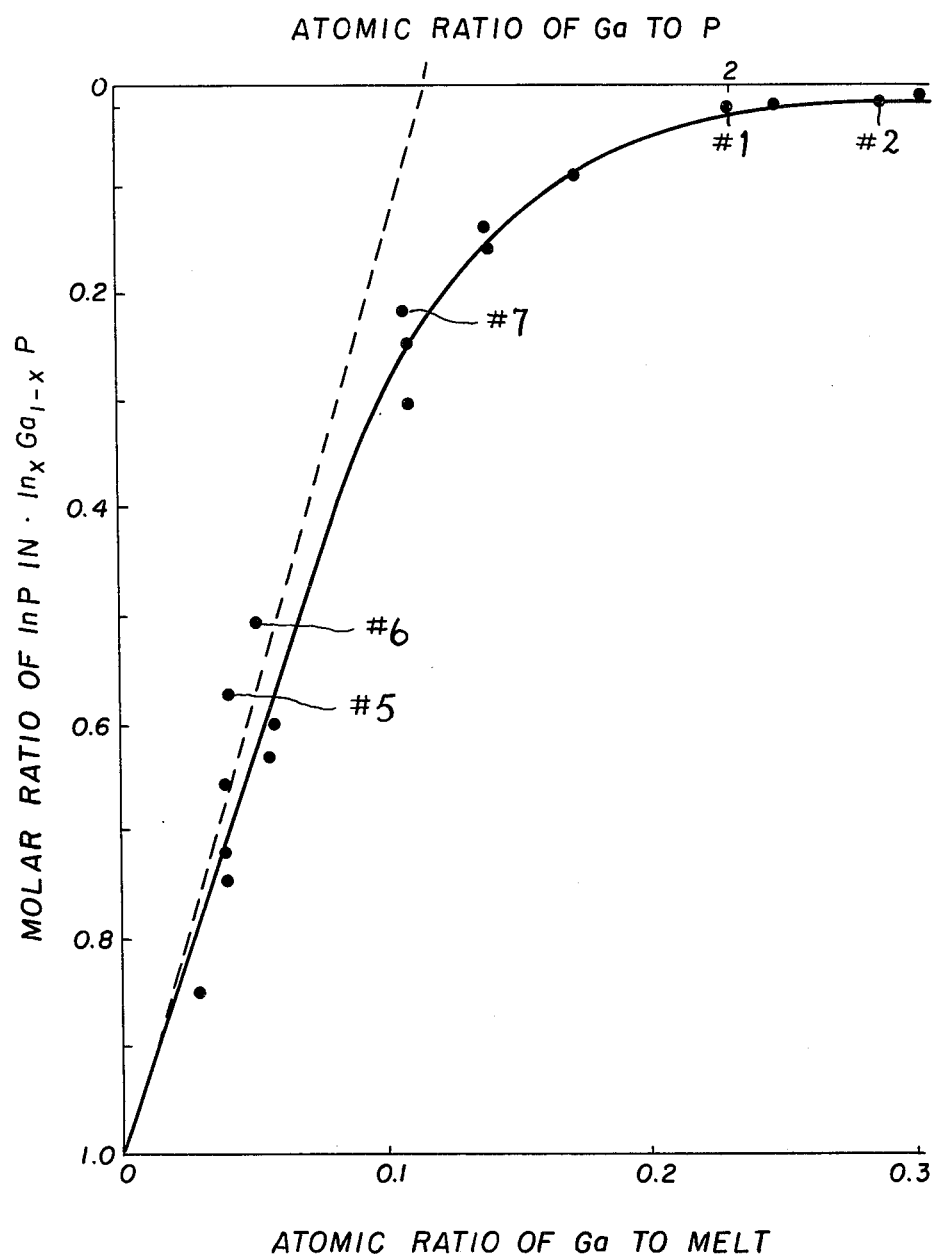
FIGS. 1 and 2 are graphs useful in explaining the principles of the present invention.

Referring now to FIG. 1 of the drawings, the solid curve describes an amount $x$ in molar ratio of indium phosphide(InP) included in a mixed crystal $In_xGa_{1-x}P$ against an amount $X_{Ga}$ in atomic ratio of gallium to the total amount of indium, gallium and phosphorous forming a melt and dotted curve describes the amount of indium phosphide against an atomic ratio $X_{Ga}/X_P$ of gallium to phosphorous in the melt. To produce such mixed crystals, numerous melts were prepared with different portions of indium, gallium and phosphorous and then slowly cooled from a high temperature of from 1,100° to 1,000°C to room temperatures. The resulting crystals were measured in terms of the amount of indium phosphide. As denoted in FIG. 1, an atomic ratio of phosphorous to indium was maintained at a value of 0.13 although atomic proportions of gallium and phosphorous could be independently changed to vary the composition of the melt. As will readily be understood, the amount $x$ of indium phosphide provides a measure of an atomic proportion of indium included in the crystal. The atomic proportion of indium in the crystal is always of $x/2$. This means that, in order to provide 1 atomic percent or less of the indium included in the crystal, the $x$ is required to have a value equal to or less than 0.02.

From FIG. 1, it can be seen that an increase in the content of gallium to render the ratio $X_{Ga}/X_P$ greater than 2.5 results in an $x$ value less than 0.01. Namely this yield a GaP crystal including indium in an amount as small as 0.5 atomic percent or less.

While in FIG. 1, the amount of gallium has changed with the amount of phosphorous remaining unchanged, it has been found that for various amounts of phosphorous different from the amount thereof used in FIG. 1, GaP crystals including 0.5 atomic percent or less of indium are produced as long as the ratio $X_{Ga}/X_P$ is equal to or greater than 2.5.

Figure 2:
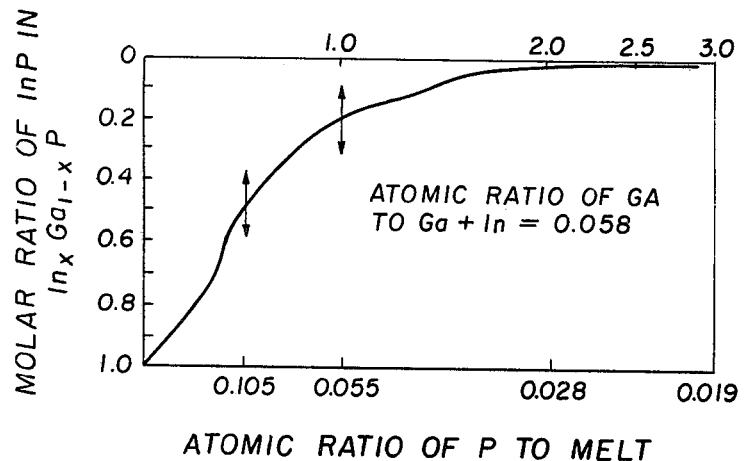
Figure 3:
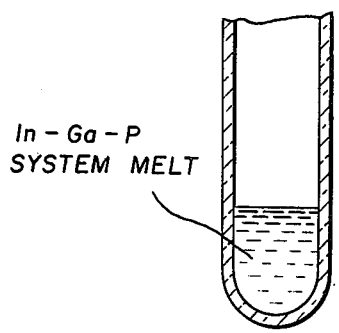
FIG. 3 is a sectional view of one portion of a growing container charged with raw materials required in accordance with the principles of the present invention.

FIG. 2 is a graph similar to FIG. 1 but illustrating an amount in molar ratio of indium phosphide (InP) plotted against an amount in atomic ratio of phosphorous included in the In-Ga-P melt and also against an atomic ratio of gallium to phosphorous $X_{Ga}/X_P$ in the melt with an atomic ratio of gallium to phosphorous kept at a value of 0.058. From FIG. 2, it can be also seen that values of the $X_{Ga}/X_P$ in excess of 2.5 yield the desired crystals including 0.5 atomic percent or less of indium. Vertical segments with the double arrow indicate the range of fluctuations of measured $x$ values.

It has been found GaP crystals including 1.0 atomic percent or less of indium are grown with $2.0 \leq X_{Ga}/X_P < 2.5$. However such GaP crystals are more or less inferior in crystallographic properties to GaP crystals grown with $X_{Ga}/X_P \geq 2.5$. Therefore the ratio $X_{Ga}/X_P$ is preferably equal to or more than 2.5. It is to be understood, however, that the ratio $X_{Ga}/X_P$ not less than 2.0 and less than 2.5 is within the scope of the present invention. Upon practicing the present invention, predetermined amount of the elements, gallium and phosphorous are charged in a quartz tube with indium, so that an atomic ratio of gallium to phosphorous is of 2.5 or more. Then the quartz tube is closed at the open end under a vacuum and heated to a temperature of from 950° to 1,100°C to form a melt. The melt is maintained at that temperature for from one to several hours and then slowly cooled to room temperature at a cooling rate of from 0.5° to 200°C per hour to produce dendritic crystals of gallium phosphide including indium in a very small amount as above specified.

It will readily be understood that phosphorous is predominantly evaporated and it vapor fills a space above the melt within the closed quartz tube. In that case, the total pressure of the vapors should not exceed 10 atmospheres in order to prevent the occurrence of a danger that the quartz tube will be burst up. Thus a maximum amount of phosphorous charged is restricted to a certain limit. However, with the melt prepared in a suitable high pressure container, for example, in a high pressure furnace, the upper limit for the phosphorous can be higher. It has been found that the phosphorous is present in an amount corresponding to from 2 to 20 atomic percent with respect to the amount of the solvent, indium with satisfactory results. If an amount of the phosphorous exceeds 20 atomic percent then the resulting melt has its melting point exceeding 1,200°C. Such a melt is not practical for use in growing single crystals from the liquid phase.

As an example, 10 grams of indium, 4.46 grams of gallium and 0.16 gram of red phosphorous were put in a quartz tube having an inside diameter of 15 milimeters and a length of 10 centimeters. Then the tube was closed at one end under a vacuum, heated to 1,100°C in one hour and maintained at that temperature for one hour. Thereafter the tube was cooled to room temperature at a cooling rate of from 100° to 0.5°C per hour. Single crystals of gallium phosphide were grown into square sheets having a thickness of 0.5 milimeter and one side 7 milimeters long with 0.5 atomic percent or less of indium present therein.

Alternatively, the temperature of the quartz tube may decrease by downwardly moving the tube within a vertical growing furnace at a predetermined speed, for example, at 1 milimeter per hour.

The process as above described was repeated with different proportions of indium, gallium and phosphorous.

The analysis of the crystals thus grown indicated that they included indium in the atomic percent not exceeding 1.0 so long as the atomic ratio of gallium to phosphorous $X_{Ga}/X_P$ is equal to or more than 2.5.

The results of the analysis is partly listed in the following Table I.

Table I

Compositions of Melt for Single Crystal of Substantially GaP

| Sample No. | Composition of Melt in Atomic Percent | | | | Amount of Indium in Grown Crystal in Atomic Percent |
|---|---|---|---|---|---|
| | Gallium $X_{Ga}$ | Phosphorous $X_P$ | Indium $X_{in}$ | $X_{Ga}/X_P$ | |
| 1 | 19.3 | 9.3 | 71.4 | 2.0 | 1.0 |
| 2 | 22.5 | 9.0 | 68.5 | 2.5 | 0.5 |
| 3 | 68.4 | 6.3 | 25.3 | 10.9 | <0.1 |
| 4 | 80.0 | 6.2 | 12.7 | 12.7 | <0.1 |

However, when the melt has an atomic ratio of gallium to phosphorous less than 2.0 the resulting crystals are of the mixed type expressed by $In_xGa_{1-x}P$ as listed in the following Table II.

Table II

Compositions of Melts for Mixed Crystal $In_xGa_{1-x}P$

| Sample No. | Composition of melt in Atomic Percent | | | $X_{Ga}/X_P$ | Amount of InP in Mixed Crystal in Molar Ratio |
|---|---|---|---|---|---|
| | Gallium $X_{Ga}$ | Phosphorous $X_P$ | Indium $X_{In}$ | | |
| 5 | 3.3 | 11.1 | 85.6 | 0.3 | 0.55 – 0.74 |
| 6 | 5.8 | 10.9 | 83.3 | 0.5 | 0.50 – 0.63 |
| 7 | 10.6 | 10.0 | 79.4 | 1.0 | 0.20 |
| 8 | 13.3 | 9.8 | 76.9 | 1.5 | 0.08 |

The melts listed in Table II have their atomic ratios of gallium to phosphorous less than 2.0 and the resulting crystals include indium in relatively large amounts.

Some of the samples listed in Tables I and II are illustrated by the corresponding numerals in FIG. 1.

As above described, the addition of gallium phosphide crystal to indium serving as a solvent results in the growth of a mixed crystal including about 0.2 atomic percent of indium. However, gallium phosphide and the element gallium in suitable proportions may be simultaneously added to indium to form a melt having a atomic ratio of gallium to phosphorous exceeding 2.5 which is also involved in the scope of the present invention.

The principles of the present invention as above described in equally applicable to the epitaxial growth of a layer on a substrate formed of a gallium phosphide crystal. More specifically, a quarts boat having disposed at both ends a melt such as above described having an atomic ratio of gallium to phosphorous exceeding 2.5 and a substrate of gallium phosphide is put in a growing furnace having an atmosphere of hydrogen or put under a vacuum. Then the furnace is heated to 1,000°C and then tilted to cover the substrate with the melt after which the melt is slowly cooled at a cooling rate of from 1° to 10°C per minute to form an epitaxially grown layer on the substrate.

From the foregoing it will be appreciated that the present invention is effectively applied, in addition to the growing processes as above described, to all growing processes of growing single crystals of substantially gallium phosphide substantially identical in behavior to those of pure gallium phosphide from melts including, as their solvent, indium rather than gallium as long as the melts have their atomic ratios of gallium to phosphorous equal to or greater than 2.5.

Figure 4:
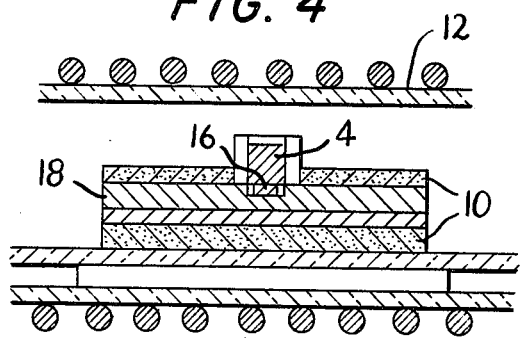
FIG. 4 is a fragmental schematic view of a device suitable for carrying out the process of the present invention.

As an example, the present invention can be carried out by using an arrangement as shown in FIG. 4. In the arrangement of FIG. 4 a carbon boat 10 is horizontally disposed in a horizontal resistance furnace 12 through which hydrogen gas continuously flows and has a container 14 put therein and including a melt such as above described. Then a substrate 16 of gallium phosphide is disposed in a recess on a slidable plate 18 subsequently positioned on the boat 10. After the furnace has reached a temperature of 1,050°C or higher, the slidable plate 18 is moved so that the substrate is located directly below the melt as shown in FIG. 4. Thereafter the furnace decreases in temperature at a rate of 50°C per hour until its temperature reaches 950°C. At that time the slidable plate 18 is withdrawn to permit the substrate to be removed from the bottom of the melt. The removed substrate has a layer of gallium phosphide epitaxially grown thereon to a thickness of about 25 microns. The chemical analysis indicated that the layer included indium in an amount corresponding to at most 0.5 atomic percent. The cooling rate may range from 0.5° to 100°C per hour. Also the more the amount of phosphorous the higher the temperature of the furnace will be and vice versa. It has been found that the temperature of the furnace is preferably between about 1,100° and about 950°C.

The following Table III lists a few melts prepared by having gallium phosphide and gallium added to indium so as to render the atomic ratio of gallium to phosphorous equal to or more than 2.0 and amounts of indium included in GaP layers epitaxially grown upon GaP substrates from those melts.

Table III

Composition of Melt for epitaxially Grown $G_P$ layer.

| Sample No. | Ingredients Added to Melt in Atomic Percent | | | Amount of In in Epitaxially Grown GaP layer in Atomic Percent |
|---|---|---|---|---|
| | GaP | Ga | $X_{Ga}/X_P$ | |
| 9 | 9.3 | 10.0 | 2.0 | 1.0 |
| 10 | 9.0 | 13.5 | 2.5 | 0.5 |
| 11 | 6.3 | 50.1 | 10.9 | <0.1 |
| 12 | 6.2 | 73.8 | 12.7 | <0.1 |

From Table III it is seen that all the epitaxially grown layer are formed substantially of gallium phosphide and include indium only in 0.5 atomic percent or less except for sample No. 9.

Although the mechanism by which single crystals of gallium phosphide are grown from the melt having an atomic ratio of gallium to phosphorous $X_{Ga}/X_P$ exceeding 2.5 is not yet definitely understood, it may be explained as follows: Phosphorous is extremely apt to react on gallium in the melt so that the two elements will be supposed to be first bonded to each other. This partly attributes to the melting point of gallium phosphide(GaP) ... 1470°C ... being very much higher than that of indium phosphide (In) ... 1062°C ... If phosphorous will be left in the melt because of the $X_{Ga}/X_P>1$, then it is bonded to indium serving as the solvent. The Ga-P bonds and $I_n$-P bonds thus formed will be collected together into a mixed crystal $In_xGa_{1-x}P$ consisting of InP and GaP having a molar proportion of $x/(1-x)$. As shown in FIG. 1, a mixed crystal includes a composition approximately represented by a point on the dotted line passing through point ($x=1$, $X_{Ga}/X_P=0$ and $x=0$, $X_{Ga}/X_P=1$) for $x$ having a value considerably smaller than one(1). If mixed crystals has respective compositions represented by corresponding points on the dotted line for x up to 1, then the indium will act simply as a solvent in the melt having the $X_{Ga}/X_P$ ratio equal to 1 while only the Ga-P bonds will be formed in the melt. Under these circumstance a single crystal of GaP may be grown or precipitated.

However, the solid line plotted with experimental data begins to be curved away from the dotted line for x having a value of about 0.2. This means that, for $X_{Ga}/X_P=1$, the phosphorous is partly bonded to the indium in the melt resulting in the growth of a mixed crystal approximately expressed by $In_{0.2}Ga_{0.8}P$. This is because the bonding force between gallium and phosphorous is not extremely high enough to permit the bonding force between indium and phosphorous to be negligible. As above described, the latter crystal can not be used as what is substantially identical in behavior to the single crystal expressed by GaP.

On the other hand, as the $X_{Ga}/X_P$ becomes greater than one(1), a probability of encountering phosphorous atoms with gallium atoms is more and more increased. After the $X_{Ga}/X_P$ has been suitably great, almost all of the phosphorous atoms will be bonded to the gallium atoms. A value of the $X_{Ga}/X_P$ for which the phenomenon just described occurs ranges from 2 and 2.5 as previously described. Therefore when phosphorous and gallium in atomic ratio of 1 to 2 are added to indium, the Ga-P bonds are predominantly formed as compared with the In-P bonds which cooperates with an increased probability of encountering phosphorous atoms with gallium atoms to precipitate or grow gallium phosphide scarcely including indium. However, it is to be understood that the present invention is not restricted to the mechanism as above described.

What is claimed is:

1. A process of producing single crystals of substantially gallium phosphide from a melt containing indium as the solvent, which process comprising heating a mixture of indium, gallium and phosphorus to form a melt and thereafter slowly cooling the melt to room temperature, wherein the melt has an atomic ratio of gallium to phosphorus equal to at least 2.5 to produce said single crystals including at most 0.5 atomic percent of indium.

2. A process as claimed in claim 1 wherein the mixture of indium, gallium and phosphorus is heated to a temperature of 950°C to 1100°C and wherein the melt is cooled from a temperature of from 950°C to 1,100°C to room temperature at a cooling rate of from 0.5° to 200°C per hour.

3. A process as claimed in claim 1 wherein the melt has disposed therein a substrate of gallium phosphide and is cooled from a temperature of from 950° to 1,100°C to room temperature at a cooling rate of from 0.5° to 100°C per hour to expitaxially grow on said substrate a layer of gallium phosphide including at most 0.5 atomic percent of indium.

* * * * *